United States Patent
Sho

(10) Patent No.: US 8,026,183 B2
(45) Date of Patent: Sep. 27, 2011

(54) METHOD OF FORMING A RESIST PATTERN

(75) Inventor: Koutaro Sho, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 12/563,954

(22) Filed: Sep. 21, 2009

(65) Prior Publication Data

US 2010/0112823 A1    May 6, 2010

(30) Foreign Application Priority Data

Oct. 30, 2008    (JP) ................. 2008-279662

(51) Int. Cl.
*H01L 21/31*    (2006.01)
*H01L 21/469*    (2006.01)

(52) U.S. Cl. ............. 438/761; 438/736; 257/E21.024; 257/E21.036; 216/55; 430/494; 430/396

(58) Field of Classification Search ........... 438/736, 438/761; 257/E21.026, E21.037, E21.024; 216/55; 430/494, 396

See application file for complete search history.

(56) References Cited

U.S. PATENT DOCUMENTS

| | | | | |
|---|---|---|---|---|
| 4,978,594 A | * | 12/1990 | Bruce et al. | 430/14 |
| 2005/0214694 A1 | * | 9/2005 | Hong et al. | 430/323 |
| 2006/0281028 A1 | * | 12/2006 | Peng et al. | 430/311 |

FOREIGN PATENT DOCUMENTS

JP    2006-119292    5/2006

* cited by examiner

*Primary Examiner* — Caridad Everhart
(74) *Attorney, Agent, or Firm* — Finnegan, Henderson, Farabow, Garrett & Dunner, L.L.P.

(57) ABSTRACT

A lower-layer film to which a fluorine-doped polymer is added is formed on a film to be processed. The lower-layer film is baked. An intermediate film is formed on the lower-layer film. A resist film is formed on the intermediate film. The resist film is baked. A resist protection film is formed. The resist film is immersion-exposed. The resist film is developed to form a resist pattern.

20 Claims, 4 Drawing Sheets

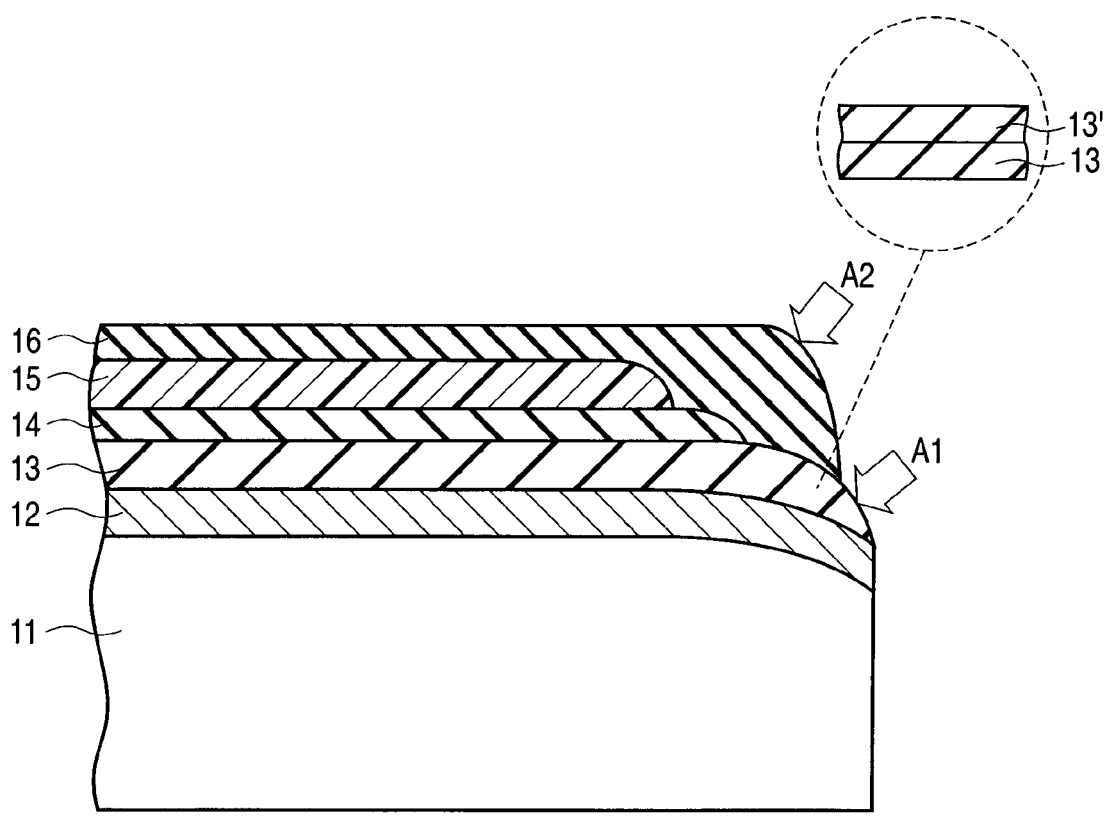
F I G. 2

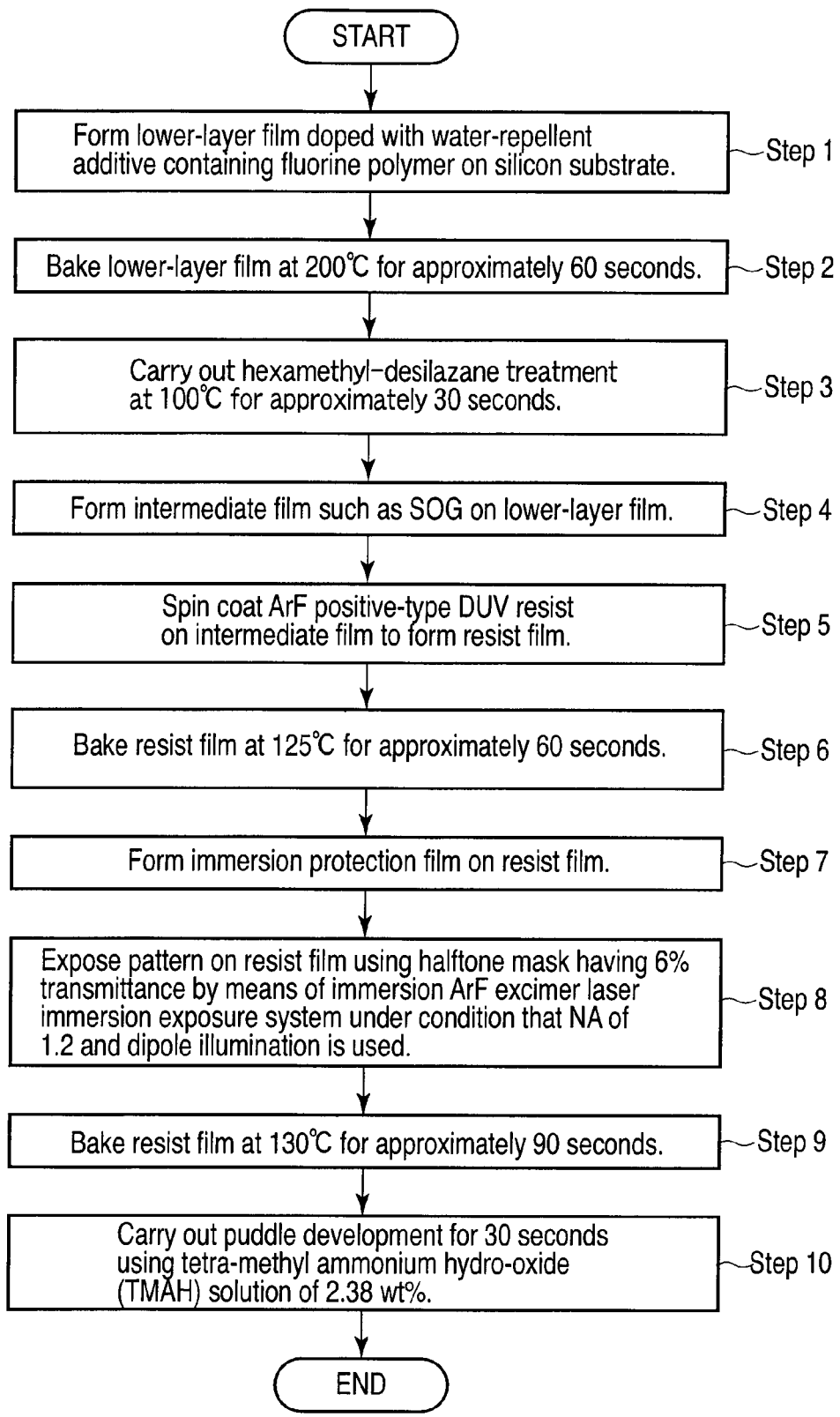
F I G. 3

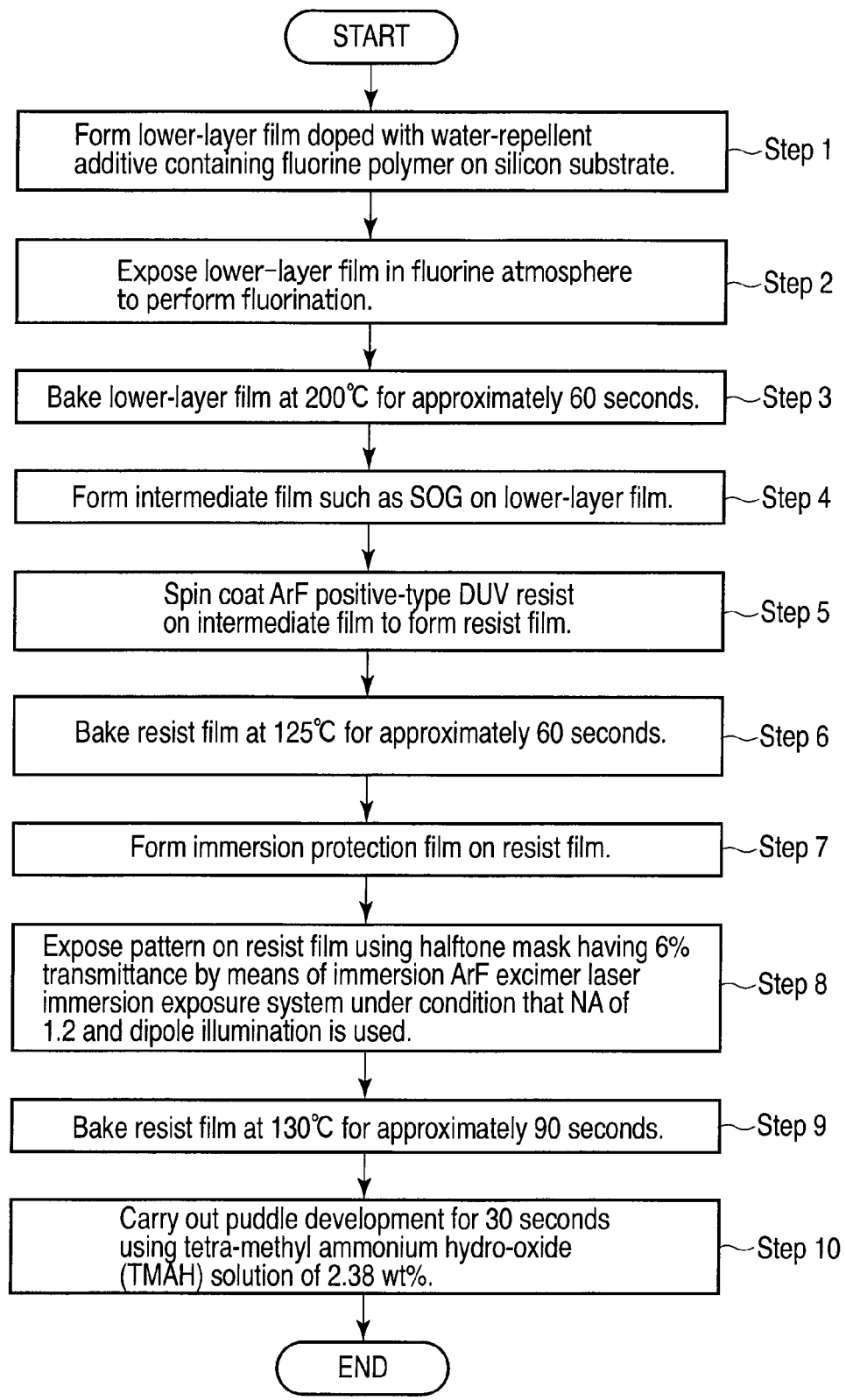
F I G. 4

METHOD OF FORMING A RESIST PATTERN

CROSS-REFERENCE TO RELATED APPLICATIONS

This application is based upon and claims the benefit of priority from prior Japanese Patent Application No. 2008-279662, filed Oct. 30, 2008, the entire contents of which are incorporated herein by reference.

BACKGROUND OF THE INVENTION

1. Field of the Invention

The present invention relates to a process of manufacturing a semiconductor device. In particular, the present invention relates to a method of forming a resist pattern for forming a micropattern on a wafer surface.

2. Description of the Related Art

In general, a process of manufacturing a semiconductor device includes many patterning processes. Specifically, according to the process of manufacturing a semiconductor device, various material layers are formed on a silicon wafer, and then, a desired pattern is formed on the silicon wafer and the material layer. In this case, a photosensitive substance called a resist is coated on a film to be processed. Then, a predetermined area of this resist film is exposed. An exposed or non-exposed portion of the resist film is removed by development to form a resist pattern. Thereafter, the film is dry-etched using the resist pattern as an etching mask.

In view of throughput, ultraviolet rays such as a KrF excimer laser and ArF excimer are used as a light source for exposing the resist film. However, advances in LSI scale reduction have been made, and therefore, the wavelength of a required resolution is shorter than that of these ultraviolet rays. For this reason, an exposure process margin such as exposure margin and focusing margin is short.

In order to solve the problem, an immersion exposure technique (e.g., see Jpn. Pat. Appln. KOKAI Publication No. 2006-119292) has been proposed and employed as a technique of improving resolution using a conventional exposure light. However, the technique has, as of today, the following problem. Specifically, an immersion liquid comes into the rear of a wafer in exposure, and thereby, there is a problem that focusing accuracy is reduced. If the immersion comes into the rear of the wafer to contact with a stage, the temperature of the immersion liquid is reduced. This temperature change of the immersion liquid is a factor of causing misalignment of a focusing position. For this reason, it is desired to solve the problem that the immersion liquid comes into the rear of the wafer.

BRIEF SUMMARY OF THE INVENTION

According to an aspect of the invention, there is provided a method of forming a resist pattern comprising: forming a lower-layer film to which a fluorine-doped polymer is added on a film to be processed on a substrate; baking the lower-layer film; forming a resist film on the lower-layer film; baking the resist film; immersion-exposing the resist film; and developing the resist film.

BRIEF DESCRIPTION OF THE SEVERAL VIEWS OF THE DRAWING

FIG. 2 is a view showing a sectional structure formed based on a process of the flowchart of FIG. 1;

FIG. 3 is a flowchart to explain a method of forming a resist pattern according to a second embodiment of the present invention; and FIG. 4 is a flowchart to explain a method of forming a resist pattern according to a third embodiment of the present invention.

DETAILED DESCRIPTION OF THE INVENTION

Figure 1:
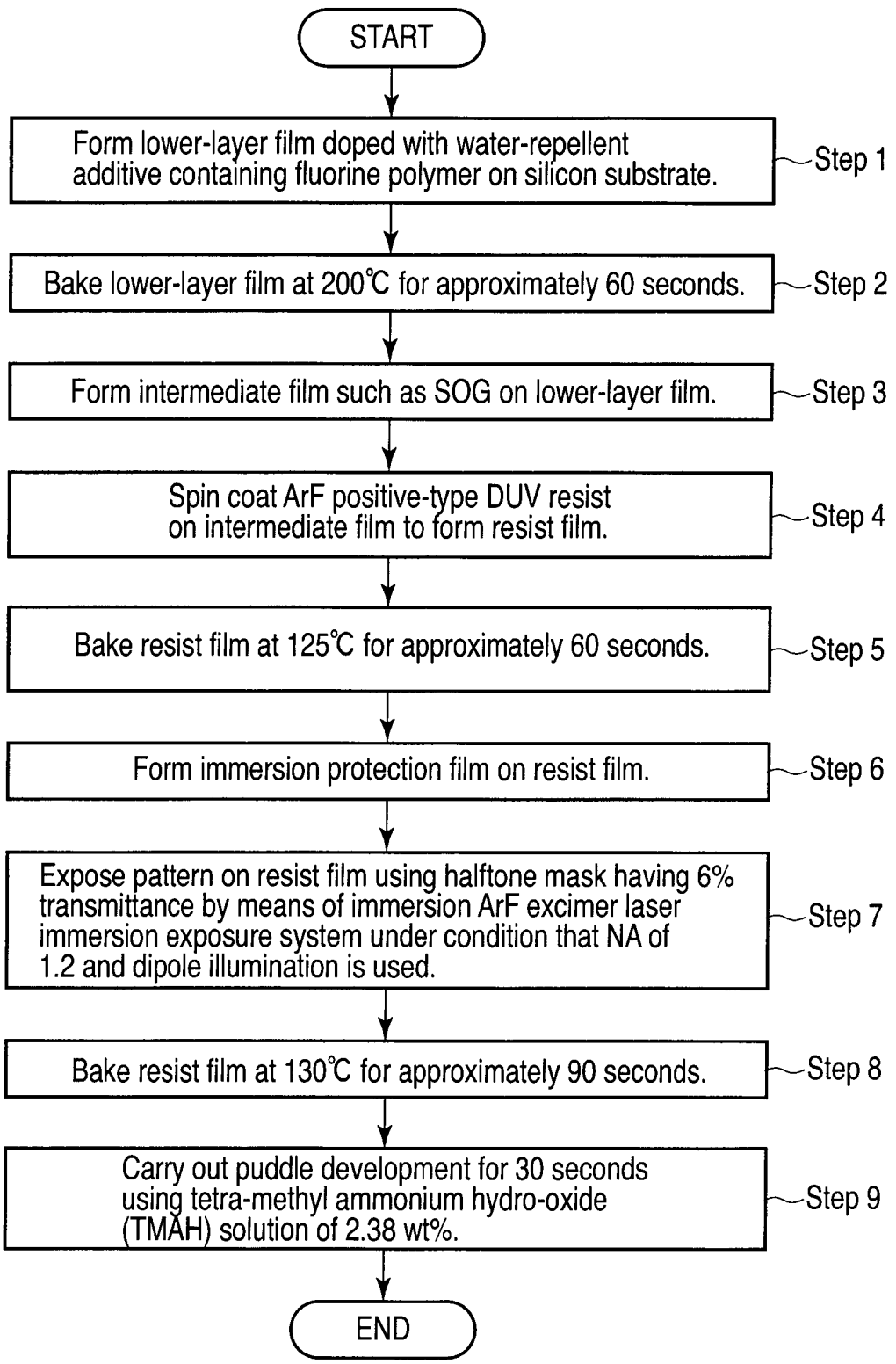
FIG. 1 is a flowchart to explain a method of forming a resist pattern according to a first embodiment of the present invention.

Various embodiments of the present invention will be hereinafter described with reference to the accompanying drawings.

This embodiment relates to a patterning process of forming a resist pattern on a film to be processed (e.g., metal film, polysilicon film, silicon oxide film) formed on a silicon wafer (silicon substrate). However, the present invention is not limited to the application.

First Embodiment

A method of forming a resist pattern according to a first embodiment will be described below with reference to FIGS. 1 and 2. FIG. 1 is a flowchart to explain the process, and FIG. 2 shows the sectional structure corresponding to the flowchart of FIG. 1.

A lower-layer film 13 having a water-repellent additive containing a fluorine-doped polymer (fluorinated polymer) is formed on a silicon substrate 11 formed with a film 12 to be processed (step 1). The lower-layer film 13 is a carbon film of thickness 80 nm having a structure stacked with an antireflection film 13'. The lower-layer film 13 is used for an etching hard mask of the film 12 to be processed. Therefore, a material of the lower-layer film 13 has high etching selectivity compared with that of the film 12 to be processed.

Then, for example, the lower-layer film 13 is baked at a temperature of 200° C. for approximately 60 seconds (step 2).

In this state, a surface contact angle A1 of the end portion of the lower-layer film 13 to the immersion liquid is more than 60° because the lower-layer film 13 has a water-repellent additive containing a fluorine-doped polymer. Further, a retreating angle is more than 70°.

Then, an intermediate film 14 such as SOG is formed on the lower-layer film 13 (step 3). Then, an ArF positive-type DUV resist is spin coated on the intermediate film 14, and thus, a resist film 15 of approximate thickness 100 nm is formed (step 4).

Thereafter, the resist film 15 is baked at a temperature of 125° C. for approximately 60 seconds (step 5).

Then, a resist protection film 16 is formed on the resist film 15 (step 6). The resist protection film 16 covers the resist film 15 and contacts the lower-layer film 13 at the end portion. In this case, the outer peripheral portion of the lower-layer film 13 may be exposed. If the resist protection film 16 is formed to cover the outer peripheral portion of the lower-layer film 13, the following problem arises. Namely, in the exposure process, there is the possibility that the outer peripheral portion of the resist protection film 16 peels because of damage with an auxiliary plate and a water-repellent plate located around a substrate stage of an exposure system. For example, a surface contact angle A2 of the resist protection film 16 is 72°, and therefore is sufficient.

A pattern is exposed on the resist film 15 using a halftone mask having a transmittance 6% by means of an immersion ArF excimer laser immersion exposure system under the condition that an NA of 1.2 and dipole illumination is used (step 7). In this case, the exposure is 28 mJ/cm$^2$, for example.

Thereafter, the resist film 15 is baked at a temperature of 130° C. for approximately 90 seconds (step 8). Puddle development is carried out for 30 seconds using a tetra-methyl ammonium hydro-oxide (TMAH) solution of 2.38 wt % (step 9). In this way, a line-and-space (L/S) pattern having a width 0.05 µm is formed.

Then, the intermediate film 14 is patterned using the resist film 15 formed with the L/S pattern, and further, the lower-layer film 13 is patterned. Thereafter, the film 12 to be processed is dry etched using the patterned lower-layer film 13.

According to the method of forming the resist pattern, the lower-layer film 13 having a water-repellent additive is formed, and thereby, the surface contact angle of the baked lower-layer film 13 is made large. This serves to prevent the immersion liquid from coming into the rear of the wafer in immersion exposure in step 7, and to prevent focusing accuracy from being reduced. The end portion of the resist protection film 16 is formed on the lower-layer film 13 so that it does not reach the outer peripheral portion of the silicon substrate. In this way, it is possible to prevent the resist protection film 16 from peeling at the outer peripheral portion of the substrate.

The first embodiment relates to the case of forming the intermediate film 14 on the lower-layer film 13, and forming the resist film 15 on the intermediate film 14. However, in this case, the resist film 15 may be formed on the lower-layer film 13 without forming the intermediate film 14. If the intermediate film 14 is not formed, when a carbon film is used as the lower-layer film 13, etching selectivity is not sufficiently obtained between the resist film 15 and the lower-layer film 13. For this reason, a normal hard mask material such as an oxide film and a nitride film is used as the lower-layer film 13. The resist protection film 16 is used for protecting the resist film 15 from the immersion liquid; however, the resist protection film 16 may not be formed.

Second Embodiment

A method of forming a resist pattern according to a second embodiment of the present invention will be explained below with reference to a flowchart of FIG. 3.

A lower-layer film having a water-repellent additive containing a fluorine-doped polymer (fluorinated polymer) is formed on a silicon substrate 11 formed with a film to be processed (step 1). The lower-layer film is a carbon film of thickness 80 nm having a structure stacked with an antireflection film.

The lower-layer film is baked at a temperature of 200° C. for approximately 60 seconds (step 2).

A hexamethyl-disilazane (HMDS) treatment is carried out with respect to the exposed surface of a silicon substrate formed with a film to be processed at a temperature of 100° C. for approximately 30 seconds (step 3). In this way, preferably, a surface contact angle of the end portion of the silicon substrate and the film to be processed with the immersion liquid is set to 60° or more. In addition, a surface contact angle of the end portion of the lower-layer film with the immersion liquid is set to 60° or more, and a retreating angle thereof is set to 70° or more.

Then, an intermediate film such as SOG is formed on the lower-layer film (step 4). An ArF positive-type DUV resist is spin coated on the intermediate film, and thus, a resist film 15 of approximate thickness 100 nm is formed (step 5).

Thereafter, the resist film is baked at a temperature of 125° C. for approximately 60 seconds (step 6). A resist protection film is formed on the baked resist film (step 7). In this case, the resist protection film is formed on the resist film so that it contacts the lower-layer film while the outer peripheral portion of the lower-layer film is exposed.

A pattern is exposed on the resist film using a halftone mask having a transmittance 6% by means of an immersion ArF excimer laser immersion exposure system under the condition that an NA of 1.2 and dipole illumination is used (step 8). In this case, the exposure is 28 mJ/cm$^2$, for example.

Thereafter, the resist film is baked at a temperature of 130° C. for approximately 90 seconds (step 9). Puddle development is carried out for 30 seconds using a tetra-methyl ammonium hydro-oxide (TMAH) solution of 2.38 wt % (step 10). In this way, a line-and-space (L/S) pattern having a width 0.05 µm is formed.

Then, the intermediate film and the lower-layer film are patterned using the resist film formed with the L/S pattern. Thereafter, the film to be processed is dry etched using the patterned lower-layer film.

According to the method of forming a pattern, the lower-layer film has a water-repellent additive so that the surface contact angle of the lower-layer film is made large. In addition, the HMDS treatment is carried out with respect to the silicon substrate and the film to be processed so that each surface contact angle is made large. This serves to prevent the immersion liquid from coming into the rear of the wafer in immersion exposure in step 8, and to prevent focusing accuracy from being reduced. The end portion of the resist protection film is formed on the lower-layer film so that it does not reach the outer peripheral portion of the silicon substrate. In this way, it is possible to prevent the resist protection film from peeling at the outer peripheral portion of the substrate.

The second embodiment relates to the case of forming the intermediate film on the lower-layer film, and forming the resist film on the intermediate film. However, in this case, the resist film may be formed on the lower-layer film without forming the intermediate film. If the intermediate film is not formed, when a carbon film is used as the lower-layer film, etching selectivity is not sufficiently obtained between the resist film and the lower-layer film. For this reason, a normal hard mask material such as an oxide film and a nitride film is used as the lower-layer film. The resist protection film is used for protecting the resist film from the immersion liquid; however, the resist protection film may not be formed.

Third Embodiment

A method of forming a resist pattern according to a third embodiment of the present invention will be explained below with reference to a flowchart of FIG. 3.

A lower-layer film having a water-repellent additive containing a fluorine-doped polymer (fluorinated polymer) is formed on a silicon substrate 11 formed with a film to be processed (step 1). The lower-layer film is a carbon film of thickness 80 nm having a structure stacked with an antireflection film.

The lower-layer film is formed, and thereafter, exposed in the fluorine atmosphere, and thereby, fluorination is performed with respect to the exposed surface of the film to be processed and a silicon substrate (step 2).

The lower-layer film is baked at a temperature of 200° C. for approximately 60 seconds (step 3).

In this state, preferably, a surface contact angle of the end portion of the silicon substrate and the film to be processed with the immersion liquid is set to 60° or more. In addition, a surface contact angle of the end portion of the lower-layer film with the immersion liquid is set to 60° or more, and a retreating angle thereof is set to 70° or more.

Then, an intermediate film such as SOG is formed on the lower-layer film (step 4). An ArF positive-type DUV resist is spin coated on the intermediate film, and thus, a resist film 15 of approximate thickness 100 nm is formed (step 5).

Thereafter, the resist film is baked at a temperature of 125° C. for approximately 60 seconds (step 6). A resist protection film is formed on the baked resist film (step 7). In this case, the resist protection film is formed on the resist film so that it contacts the lower-layer film while the outer peripheral portion of the lower-layer film is exposed.

A pattern is exposed on the resist film using a halftone mask having a transmittance 6% by means of an immersion ArF excimer laser immersion exposure system under the condition that an NA of 1.2 and dipole illumination is used (step 8). In this case, the exposure is 28 mJ/cm$^2$, for example.

Thereafter, the resist film is baked at a temperature of 130° C. for approximately 90 seconds (step 9). Puddle development is carried out for 30 seconds using a tetra-methyl ammonium hydro-oxide (TMAH) solution of 2.38 wt % (step 10). In this way, a line-and-space (L/S) pattern having a width 0.05 μm is formed.

Then, the intermediate film and the lower-layer film are patterned using the resist film formed with the L/S pattern. Thereafter, the film to be processed is dry etched using the patterned lower-layer film.

According to the method of forming a pattern, the lower-layer film has a water-repellent additive so that the surface contact angle of the lower-layer film is made large. In addition, the lower-layer film is formed, and thereafter, fluorination is performed with respect to the exposed surface of the film to be processed and the silicon substrate so that each surface contact angle is made large. This serves to effectively prevent the immersion liquid from coming into the rear of the wafer in immersion exposure in step 8, and to prevent focusing accuracy from being reduced. The end portion of the resist protection film is formed on the lower-layer film so that it does not reach the outer peripheral portion of the silicon substrate. In this way, it is possible to prevent the resist protection film from peeling at the outer peripheral portion of the substrate.

The second embodiment relates to the case of forming the intermediate film on the lower-layer film, and forming the resist film on the intermediate film. However, in this case, the resist film may be formed on the lower-layer film without forming the intermediate film. If the intermediate film is not formed, when a carbon film is used as the lower-layer film, etching selectivity is not sufficiently obtained between the resist film and the film. For this reason, a normal hard mask material such as an oxide film and a nitride film is used as the lower-layer film. The resist protection film is used for protecting the resist film from the immersion liquid; however, the resist protection film may not be formed.

As described above, according to the embodiments of the present invention, it is possible to prevent the reduction of focusing accuracy, and therefore, to form a micropattern having a preferable shape without largely change an exposure system and a resist material.

The second and third embodiments relates to the case of carrying out the after-treatment of the formed lower-layer film with respect to the entire surface of the wafer. The present inventors confirmed the following matter from experiment. Namely, the treatment may be carried out with respect to the limited range within 1 cm from the outermost periphery of the wafer.

According to the first to third embodiments, the present inventors confirmed the following matter. Namely, in order to prevent the immersion liquid from coming into the rear of the wafer in immersion exposure, preferably, the surface contact angle of the baked lower-layer film is set to 60° or more. There is almost no problem so long as the surface contact angle is set to 70° or more. Further, it can be seen that the retreating angle of the baked lower-layer film is set to 70° or more.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a resist pattern, comprising:
   forming a lower-layer film to which a fluorine-doped polymer is added on a film to be processed on a substrate;
   baking the lower-layer film;
   forming a resist film on the lower-layer film;
   baking the resist film;
   forming a resist protection film on the resist film, the resist protection film contacting the lower-layer film, and an outer peripheral portion of the lower-layer film being exposed;
   immersion-exposing the resist film; and
   developing the resist film.

2. The method according to claim 1, wherein the lower-layer film includes an oxide film or a nitride film, and is used as an etching mask of the film to be processed.

3. The method according to claim 1, wherein a contact angle of the resist protection film with an immersion liquid used for the immersion exposure is set to 70° or more.

4. The method according to claim 1, further comprising:
   carrying out a hexamethyle-disilazane treatment with respect to the substrate and the film to be processed after the lower-layer film is formed and before the resist film is formed.

5. The method according to claim 4, wherein the hexamethyle-disilazane treatment is carried out with respect to only an end portion of the substrate and the film to be processed.

6. The method according to claim 4, wherein a contact angle of the substrate or the film to be processed in which the hexamethyle-disilazane treatment is carried out, with an immersion liquid used for the immersion exposure is set to 60° or more.

7. The method according to claim 1, further comprising:
   performing fluorination with respect to the substrate or the film to be processed by exposing the lower-layer film in a fluorine atmosphere after the lower-layer film is formed and before the resist film is formed.

8. The method according to claim 7, wherein the fluorination is performed with respect to only an end portion of the substrate or the film to be processed.

9. The method according to claim 7, wherein a contact angle of the substrate or the film to be processed in which the fluorination is performed, with an immersion liquid used for the immersion exposure is set to 60° or more.

10. The method according to claim 1, wherein the lower-layer film includes a carbon film, and is used as an etching mask of the film to be processed.

11. The method according to claim 10, further comprising:
    forming an intermediate film including SOG on the lower-layer film after the lower-layer film is formed and before the resist film is formed.

12. The method according to claim 10, wherein the lower-layer film has a structure in which an anti-reflection film is stacked on the carbon film.

13. A method of forming a resist pattern, comprising:
forming a lower-layer film to which a fluorine-doped polymer is added on a film to be processed on a substrate;
baking the lower-layer film;
forming a resist film on the lower-layer film;
baking the resist film;
immersion-exposing the resist film; and
developing the resist film,
wherein a contact angle of the lower-layer film with an immersion liquid used for the immersion exposure is set to 60° or more, and a retreating contact angle thereof is set to 70° or more.

14. The method according to claim 13, wherein the lower-layer film includes a carbon film, and is used as an etching mask of the film to be processed.

15. The method according to claim 13, wherein the lower-layer film includes an oxide film or a nitride film, and is used as an etching mask of the film to be processed.

16. The method according to claim 13, further comprising:
carrying out a hexamethyle-disilazane treatment with respect to the substrate and the film to be processed after the lower-layer film is formed and before the resist film is formed.

17. The method according to claim 16, wherein the hexamethyle-disilazane treatment is carried out with respect to only an end portion of the substrate and the film to be processed.

18. The method according to claim 16, wherein a contact angle of the substrate or the film to be processed in which the hexamethyle-disilazane treatment is carried out, with an immersion liquid used for the immersion exposure is set to 60° or more.

19. The method according to claim 13, further comprising:
performing fluorination with respect to the substrate or the film to be processed by exposing the lower-layer film in a fluorine atmosphere after the lower-layer film is formed and before the resist film is formed.

20. The method according to claim 19, wherein the fluorination is performed with respect to only an end portion of the substrate or the film to be processed.

* * * * *